United States Patent
Potyrailo et al.

(10) Patent No.: US 11,280,814 B2
(45) Date of Patent: Mar. 22, 2022

(54) SYSTEMS AND METHODS FOR WEARABLE VOLTAGE SENSING DEVICES

(71) Applicant: General Electric Company, Schenectady, NY (US)

(72) Inventors: Radislav Alexandrovich Potyrailo, Niskayuna, NY (US); Nancy Cecelia Stoffel, Schenectady, NY (US); Cheng-Po Chen, Niskayuna, NY (US); Emad Andarawis Andarawis, Clifton Park, NY (US)

(73) Assignee: GENERAL ELECTIC COMPANY, Niskayuna, NY (US)

( * ) Notice: Subject to any disclaimer, the term of this patent is extended or adjusted under 35 U.S.C. 154(b) by 11 days.

(21) Appl. No.: 16/843,142

(22) Filed: Apr. 8, 2020

(65) Prior Publication Data
US 2021/0318362 A1    Oct. 14, 2021

(51) Int. Cl.
*G01R 19/155* (2006.01)
*G08B 21/02* (2006.01)
*G01R 1/18* (2006.01)
*G01R 1/067* (2006.01)

(52) U.S. Cl.
CPC ....... *G01R 19/155* (2013.01); *G01R 1/06788* (2013.01); *G01R 1/18* (2013.01); *G08B 21/02* (2013.01)

(58) Field of Classification Search
None
See application file for complete search history.

(56) References Cited

U.S. PATENT DOCUMENTS

| | | | |
|---|---|---|---|
| 6,329,924 B1 * | 12/2001 | McNulty | G01R 29/0857 340/552 |
| 6,828,767 B2 | 12/2004 | Douglas | |
| 7,151,447 B1 * | 12/2006 | Willms | G08B 13/1654 340/540 |
| 7,733,078 B2 | 6/2010 | Duke | |
| 8,575,942 B2 | 11/2013 | Dorr et al. | |
| 9,494,632 B1 | 11/2016 | McNulty | |
| 9,666,058 B2 | 5/2017 | Kalokitis et al. | |
| 10,024,893 B2 | 7/2018 | Ambrosio et al. | |
| 10,247,763 B1 | 4/2019 | Wu et al. | |
| 2012/0104868 A1 * | 5/2012 | Baarman | H02J 7/025 307/104 |

(Continued)

FOREIGN PATENT DOCUMENTS

WO    2017083901 A1    5/2017

OTHER PUBLICATIONS

Zhou et al., "AuraSense: Enabling Expressive Around-Smartwatch Interactions with Electric Field Sensing", Proceeding UIST '16 Proceedings of the 29th Annual Symposium on User Interface Software and Technology, pp. 81-86,Tokyo, Japan, Oct. 16-19, 2016.

*Primary Examiner* — Jas A Sanghera
(74) *Attorney, Agent, or Firm* — Fletcher Yoder, P.C.

(57) ABSTRACT

In accordance with the present disclosure, voltage sensing techniques using a voltage sensing device are employed to identify sources of electromagnetic radiation and provide warnings to a user about high levels of electromagnetic radiation. By way of example, the voltage sensing device may be a wearable device and may provide auditory, visual, and tactile alerts to a user.

20 Claims, 4 Drawing Sheets

(56) References Cited

U.S. PATENT DOCUMENTS

| | | | |
|---|---|---|---|
| 2012/0299604 A1* | 11/2012 | Waugaman | G01R 29/12 |
| | | | 324/629 |
| 2014/0058691 A1* | 2/2014 | Kalokitis | G06T 11/60 |
| | | | 702/65 |
| 2016/0080035 A1 | 3/2016 | Fuchs et al. | |
| 2019/0277617 A1 | 9/2019 | Chen et al. | |

* cited by examiner

SYSTEMS AND METHODS FOR WEARABLE VOLTAGE SENSING DEVICES

BACKGROUND

The subject matter disclosed herein relates to voltage sensing devices.

Wearable and other voltage sensing devices are forms of personal protection equipment used to detect active voltage sources within a short distance, such as less than ten meters, from the voltage sensing device. Wearable and other voltage sensing devices experience a diverse range of conditions that can affect the accuracy of electric field measurements. For example, static charge build-up, mechanical distortions, temperature effects, and other environmental or application specific factors can affect signals generated by a voltage sensing device and can result in poor performance or insufficient operation (e.g., false alarms, delayed warnings, missed detections, and so forth) by the voltage sensing device.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible embodiments. Indeed, the invention may encompass a variety of forms that may be similar to or different from the embodiments set forth below.

In one embodiment, a wearable device includes a sensor configured to detect electromagnetic radiation and generate a set of signal data over a first time period in response to detected electromagnetic radiation. The wearable device also includes a processor communicatively coupled to the sensor. In certain embodiments, the processor is configured to identify a first signal of the set of signal data and a second signal of the set of signal data, the first signal having a frequency in a frequency range and the second signal is associated with an interference signal. The processor is also configured to determine, based on the identification, a portion of the detected electromagnetic radiation associated with the first signal and determine whether a portion of the detected electromagnetic radiation associated with the first signal exceeds a threshold level. In certain embodiments, the processor is configured to perform an action based on a determination that the portion of the electromagnetic radiation exceeds the threshold level.

In another embodiment, a method includes generating a set of signal data over a first time period in response to detected electromagnetic radiation and identifying a first signal of the set of signal data and a second signal of the set of signal data, the first signal having a frequency in a frequency range and the second signal is associated with an interference signal. The method also includes determining, based on the identification, whether a voltage level of the first signal exceeds a threshold voltage level and performing an action based on the voltage level of the first signal exceeding the threshold voltage level.

In another embodiment, a diagnostic tool includes a sensor configured to detect electromagnetic radiation and generate a set of signals over a first time period in response to detected electromagnetic radiation and a processor communicatively coupled to the sensor. In the embodiment, the processor is configured to identify at least one signal from the set of signals, the at least one signal having a frequency in a frequency range and compare the at least one signal to a set of device profiles, each device profile corresponding to a different source of electromagnetic radiation. The processor is also configured to determine a source of electromagnetic radiation for the at least one signal based on the comparison.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION OF THE INVENTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be nonlimiting, and thus additional numerical values, ranges, and percentages are within the scope of the disclosed embodiments.

A wearable device is a device that is worn by a subject, held by a subject, or attached to a subject, article of clothing, integrated into clothing, including integrated into personal protection clothing, attached or integrated into hard hat or another wearable article. The subject can be a human or an automated device such as robot or a drone.

The present disclosure relates to voltage sensing devices. Based on the signals generated by a voltage sensing device, feedback can be provided to a user. For example, the voltage sensing device detects proximity to active alternating current (AC) voltage sources and alerts a user accordingly. Detailed information about the source(s) of the electromagnetic radiation corresponding to the signals may reduce the number of false alerts and may ensure accurate alerts and warnings are promptly indicated to the user.

Figure 1:
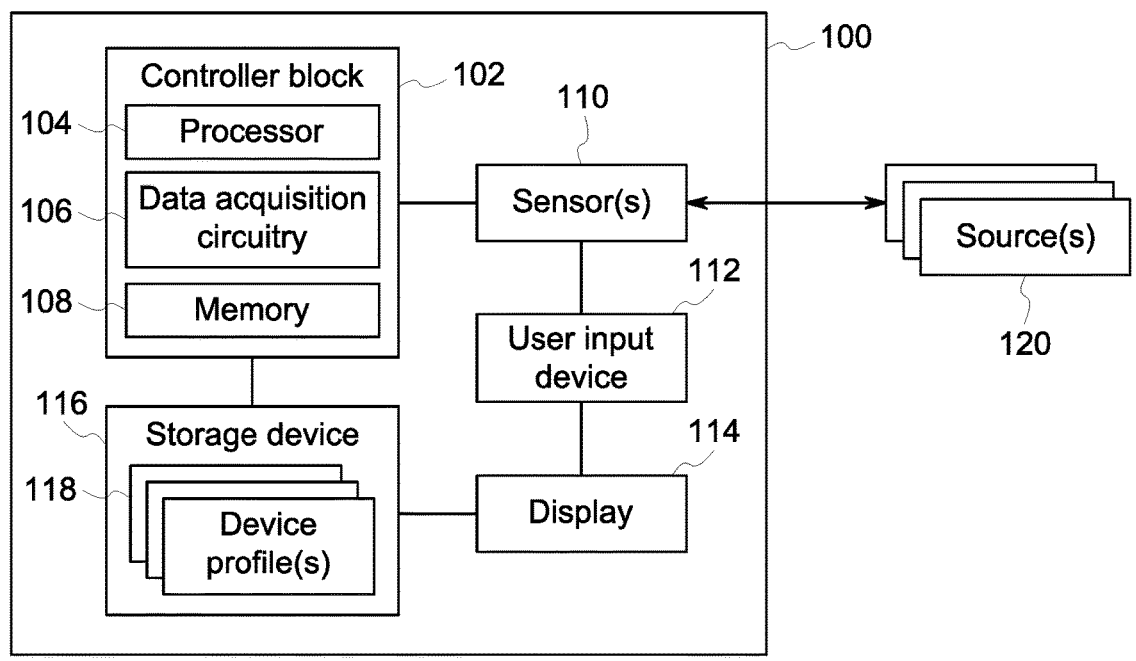
FIG. 1 is a schematic diagram of a voltage sensing system, in accordance with an embodiment of the present disclosure.

With the preceding comments in mind, FIG. 1 illustrates a schematic diagram of an embodiment of a voltage sensing system 100 that may identify a source (e.g., origin) of electromagnetic radiation, as described herein. The voltage sensing system 100 may include a controller block 102, a sensor 110, a user input device 112, a display 114, and a storage device 116. The controller block 102 may control operation of the sensor 110 and may process sensor data acquired by the sensor 110. The sensor 110 may be communicatively coupled to the controller block 102 by any suitable techniques for communicating sensor data and control signals between the controller block 102 and the sensor 110 such as a wireless, optical, coaxial, or other suitable connection.

The sensor 110 may generate sensor data in response to exposure to electromagnetic radiation. In certain embodiments, the sensor data may include a set of voltages and a corresponding set of frequencies. For example, any number of sources 120 may be active AC voltage sources located near the sensor 110. The sources 120 may be an energized and/or current carrying electrical device, an energized wire, a transmission line, a transformer, a switchgear, or any other suitable AC voltage source. In certain embodiments, the sensor 110 may be capable of detecting AC voltages in a range from fifty to one thousand volts. In some embodiments, the sensor 110 may be a loop of wire, a conductive trace, a conductive surface, or any other suitable voltage sensing configuration. In certain embodiments, the sensor 110 may detect electromagnetic radiation within five meters from the source 120 of the electromagnetic radiation. For example, the sensor 110 may detect a source producing five hundred volts of electromagnetic radiation while the sensor 110 is located within and including five meters from the source 120. As another example, the sensor 110 may detect a source producing one hundred volts of electromagnetic radiation while the sensor 110 is located within and including one meter from the source 120. In some embodiments, the sensor 110 may have an omnidirectional detection range. As a result, the sensor 110 may detect electromagnetic radiation emitted from a source 120 located in any direction relative to the sensor 110. The sensor 110 may detect electromagnetic radiation over a time period. For example, the sensor 110 may detect fluctuations in electromagnetic radiation over a user specified or pre-determined time interval. In certain embodiments, the sensor 110 may have a high temporal resolution. Nonlimiting examples of the temporal resolution needed for sensor are from 1 microsecond to 10 seconds and from 1 millisecond to 1 second.

Additionally or alternatively, the voltage sensing system 100 may include any number of sensors of the same or different types or configurations. In certain embodiments, one or more of the sensors may be an electric field sensing component. In some embodiments, one or more of the sensors may be a magnetic field sensing component. The sensors may be distributed throughout a device incorporating the voltage sensing system 100 to ensure broad sensing coverage of an area.

As will be appreciated, the controller block 102 may include a number of elements to control operation of the sensor 110 and facilitate production and/or interpretation of sensor data. For instance, as illustrated, the controller block 102 may include a processor 104, data acquisition circuitry 106, and memory 108.

The data acquisition circuitry 106 may be communicatively coupled to the processor 104. The data acquisition circuitry 106 may include receiving and conversion circuitry. The data acquisition circuitry 106 may receive the set of sensor data generated by the sensor 110 representing sensed voltage from a source 120. In certain embodiments, the data acquisition circuitry 106 may perform filtering and/or amplification on the set of sensor data. For example, the data acquisition circuitry 106 may filter out components of the set of sensor data outside of a specified frequency range, such as between forty Hz and four hundred Hz. Alternatively, the data acquisition circuitry 106 may filter out components of the set of sensor data outside of a frequency range between forty Hz to sixty Hz. The data acquisition circuitry 106 may generate a set of signal data corresponding to the set of sensor data and may transmit the set of signal data to the processor 104.

The processor 104 may receive the set of signal data from the data acquisition circuitry 106. The set of signal data may correspond to electromagnetic radiation sensed at the sensor 110. The processor 104 may process the set of signal data to determine an origin of the electromagnetic radiation. The processor 104 may perform any number of signal processing steps on the set of signal data including Fourier transform analysis, frequency-domain analysis, wavelet analysis, principal components analysis, neural network analysis, hierarchical cluster analysis, or any other suitable signal processing analysis. In certain embodiments, the processor 104 may perform multivariate signal processing. Multivariate signal processing may include analysis of more than one variable in a set of signal data and may determine relationships among the variables. For example, the processor 104 may perform a Fourier transform analysis on the set of signal data received via the data acquisition circuitry 106. The processor 104 may transform the signal data from a time domain representation to a frequency domain representation. For example, the processor 104 may process the signal data and separate a waveform associated with the signal data showing fluctuations in frequency over time into a set of signal components each with a corresponding frequency. In certain embodiments, the processor 104 may filter the Fourier transformed set of signal data. For example, the processor 104 may filter out components of the Fourier transformed set of signal data outside of a specified frequency range, such as between forty and four hundred Hz. Alternatively, the processor 104 may filter out components of the Fourier transformed set of signal data outside of a frequency range between forty to sixty Hz.

In some embodiments, the processor 104 may perform principal component analysis on the Fourier transformed set of signal data to identify interference signals and/or sources 120 of electromagnetic radiation. The processor 104 may process the Fourier transformed set of signal data and separate the Fourier transformed set of signal data according to an amount of variance. For example, the principal component analysis may focus on the periodicity and the frequency of the Fourier transformed set of signal data relative to when no signal is detected. In certain embodiments, active AC voltage sources may have more steady periodicity and less amplitude fluctuations relative to outside interference. Outside interference signals may be associated with mechanical interference, ambient background electromagnetic radiation, vibrations, electric charge build-up, electrostatic interference, and any other suitable forms of interference. The processor 104 may identify a portion of the set of signal data corresponding to active AC voltage sources.

The voltage sensing system 100 may include the storage device 116. The storage device 116 may be a database and may be communicatively coupled to the controller block 102 by any suitable techniques for communicating data and signals between the storage device 116 and the controller block 102. The storage device 116 may contain any number of device profiles 118 corresponding to different sources of active AC voltage. For example, a device profile 118 may include a device name, a device type, a manufacturer, a model number, a characteristic frequency, a characteristic voltage, a number of phases, a phase angle between phases, or any other suitable identification information for an active AC voltage source. The processor 104 may compare the signal data to the set of device profiles 118 stored in the storage device 116.

In certain embodiments, the voltage sensing system 100 may identify any number of device profiles from the set of device profiles 118 based on the set of signal data. For example, multiple device profiles may be identified in the set of signal data. The identified set of device profiles may be a combination of device profiles when the identification result shows more than one device. In some embodiments, the combination of device profiles may define effects from more than one device, thus the first signal is detected from multiple devices. In certain embodiments, the voltage sensing system 100 may perform a calculation of a match of the first signal to the stored device profiles. Nonlimiting examples of the matching methods include probabilistic, maximum likelihood, regression, and any other.

The processor 104 may analyze the signal data and may determine a device associated with a signal component based on the comparison. The processor 104 may measure a voltage associated with the signal component based on the sensed voltage from the sensor 110. In certain embodiments, the processor 104 may measure the voltage based on the root mean square amplitude of the sensed voltage over one cycle. In some embodiments, the processor 104 may measure the voltage based on a peak amplitude of the sensed voltage. For example, the processor 104 may determine a frequency associated with the signal component is within a threshold similarity amount of the characteristic frequency of a device profile 118. In certain embodiments, the processor 104 may determine a device associated with a signal component based on a comparison with multiple identifying features associated with the device profile 118. For example, the processor 104 may determine the frequency associated with the signal component, the voltage associated with the signal component, and a number of phases associated with the signal component all are within respective threshold similarity amounts of a characteristic frequency associated with the device profile 118, a characteristic voltage associated with the device profile 118, and a number of phases associated with the device profile 118, respectively. The processor 104 may identify the source of the signal component and may send a signal to the display 114 to generate an indication associated with the identified source. For example, the indication may include the device type, the device name, the manufacturer of the device, and/or the model number of the device.

The processor 104 may perform a diagnostic analysis on a source of electromagnetic radiation, may produce and send a diagnostic report, and may provide a repair suggestion based on the diagnostic analysis. In certain embodiments, the user input device 112 may be capable of receiving an input from a user to select a device profile 118 stored in the storage device 116. For example, the user of the voltage sensing system 100 may identify a device in need of repair and may select the corresponding device profile 118 using the user input device 112. Alternatively, the processor 104 may identify the device based on a comparison between signal data detected by the sensor 110 and the set of stored or otherwise pre-determined device profiles 118. The processor 104 may compare the device profile 118 to signal data detected by the sensor 110 and may produce a diagnostic report. For example, the processor may send a signal to the display 114 to generate an indication associated with the diagnostic report. In certain embodiments, the processor 104 may provide a repair suggestion based on the comparison, such as identification of a faulty component. For example, the processor 104 may determine a part of the device needs to be replaced and may send a message to place an order for the part.

The processor 104 may determine a sensed voltage associated with the signal data and may compare the sensed voltage to a threshold voltage. In certain embodiments, the processor 104 may send a signal to the display 114 to generate an alert in response to the sensed voltage meeting or exceeding the threshold voltage. In some embodiments, the alert may be an audio alert, a visual alert, and/or a tactile alert. Additionally or alternatively, the processor 104 may send a shut-off signal to the active AC voltage source or power-controller unit controlling the power supply to the identified device in response to the sensed voltage exceeding the threshold voltage. In some embodiments, the processor 104 may send a signal to a vehicle to move away from the active AC voltage source in response to the sensed voltage exceeding the threshold voltage. Additionally or alternatively, the processor 104 may send a signal indicative of the alert to other nearby voltage sensing devices. In certain embodiments, the threshold voltage may be a dynamic voltage and may be adjustable by a user with the user input device 112. For example, the threshold voltage may be fifty volts, one hundred volts, two hundred volts, five hundred volts, one thousand volts, and so on.

In some embodiments, the memory 108 may include one or more tangible, non-transitory, computer-readable media that store instructions executable by the processor 104 and/or data to be processed by the processor 104. For example, the memory 108 may include random access memory (RAM), read only memory (ROM) rewritable non-volatile memory such as flash memory, hard drives, optical discs, and/or the like. Additionally, the processor may include one or more general purpose microprocessors, one or more application specific integrated circuits (ASICs), one or more field programmable logic arrays (FPGAs), or any combination thereof. Further, the memory 108 may store sensor data obtained via the sensor 110, signal data generated via the data acquisition circuitry 106, and/or algorithms utilized by the processor 104 and/or the data acquisition circuitry 106 to help receive and/or process the sensor data obtained via the sensor 110 and/or the signal data generated via the data acquisition circuitry 106. In certain embodiments, the controller block 102 may include additional elements not shown in FIG. 1, such as additional data acquisition and processing controls, display panels, user interfaces, and so forth.

The user input device 112 may be capable of receiving an input from a user to begin and/or terminate a sensing mode. In some embodiments, the user input device 112 may be capable of receiving an input from a user to generate an alert. In certain embodiments, the user input device 112 may be capable of receiving an input from a user to decline generating an alert. The user input device 112 may be communicatively coupled to the display 114 by any suitable techniques for communicating signals between the user input device 112 and the display 114 such as a wireless, optical, coaxial, or other suitable connection. In some embodiments, the user input device 112 may be a portion of the display 114. For example, the user input device 112 may be a touch screen. The display 114 may provide an indication of a current operating mode of the voltage sensing system 100. The display 114 may also provide an indication of the sensed voltage and may also provide an indication that the voltage sensing system 100 suggests generating and/or sending an alert based on the sensed voltage. In some embodiments, the user input device 112 may include a set of buttons. For example, the user input device 112 may include a start sensing button, a cancel sensing button, a confirmation button, a cancellation button, or any combination thereof. Based on a first input received at the user input device 112, the processor 106 may output a signal to the sensor 110 to begin a voltage sensing mode. Alternatively, the sensor 110 may be a passive sensor and may continuously monitor for electromagnetic radiation.

The display 114 may be communicatively coupled to the controller block 102 by any suitable techniques for communicating control signals between the controller block 102 and the display 114 such as a wireless, optical, coaxial, or other suitable connection. The display 114 may be capable of generating an alert in response to a signal from the processor 104. In certain embodiments, the alert may be an audio alert, a visual alert, and/or a tactile alert. For example, the alert may include a blinking light, a color-changing light, an audible signal, and/or a vibration. In some embodiments, the processor 104 may generate the alert and may send the alert to a separate device. For example, the processor 104 may send a message indicative of the alert to other voltage sensing devices in a specified area and the other voltage sensing devices may generate the alert in response to receiving the message.

Figure 2:
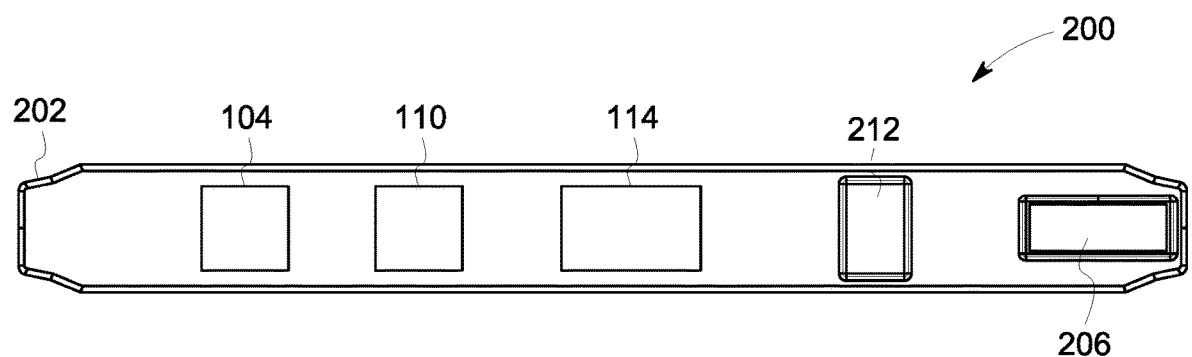
FIG. 2 is a schematic diagram of a device incorporating a voltage sensing system, such as the voltage sensing system of FIG. 1, in accordance with an embodiment of the present disclosure.

With the preceding in mind, and turning to FIG. 2, a schematic diagram of a device 200 incorporating and enclosing a voltage sensing system, such as voltage sensing system 100 in FIG. 1, is illustrated. In certain embodiments, the device 200 may be a wearable device, such as a device sized, shaped, and/or otherwise configured to be worn on a wrist or other part of an arm. In other embodiments the device 200 may be configured to be carried or attached to an article of clothing, such as within a pocket or clipped to a vest, jacket, shirt, belt, and so forth. In certain embodiments, the device 200 includes a housing 202. The housing 202 may contain a plurality of components, as described herein. In some embodiments, the housing 202 may be fabricated from an electrically dissipative material. For example, the electrically dissipative material may have a resistivity in a range from $1\times10^8$ ohm centimeters to $1\times10^{10}$ ohm centimeters. As such, the housing 202 may reduce charge build-up on the device 200. In some embodiments, the housing 202 may be shaped to be a wearable device. For example, as depicted in FIG. 2, the housing 202 may be a wristband. Alternatively, the housing 202 may be a glove, a vest, a helmet, an armband, an item attachable to a garment, or any other suitable shape for a wearable device. In certain embodiments, a portion of the housing 202 may be formed of an electromagnetic shielding material. For example, the electromagnetic shielding portion of the housing 202 may be located adjacent a sensor component, such as sensor 110 of the device 200. The electromagnetic shielding portion of the housing 202 may prevent or limit detection of electromagnetic radiation by the sensor component. For example, the electromagnetic shielding material may prevent detection of electromagnetic radiation from a range of directions relative to the sensor component. For example, the electromagnetic shielding material may be formed in the housing 202 to prevent interference signals from other devices carried by and/or located near the user of the device 200.

The device 200 may include a coupling mechanism 206 for coupling a first end of the device 200 to a second end of the device 200 (i.e., to form a loop around a user's wrist and/or arm). In some embodiments, the coupling mechanism 206 may include a hook and loop fastener, a clasp fastener, a buckle fastener, a magnetic fastener, a snap-fit fastener, or any other suitable coupling device.

The device 200 may include a number of electronic components such as a processor 104, a sensor 110, a display 114, and a battery 212. The processor 104 may be similar to the processor 104 in FIG. 1. The sensor 110 may be similar to the sensor 110 in FIG. 1. The sensor 110 may be communicatively coupled to the processor 104 by any suitable communication techniques for communicating signal data, sensor data, and/or control signals between the sensor 110 and the processor 104.

The display 114 may be similar to the display 114 in FIG. 1 The display 114 may provide visual alerts and/or may be used to indicate a charge status or power level of the device 200. In some embodiments, the battery 212 may be a rechargeable battery. In certain embodiments, the device 200 may include additional elements not shown in FIG. 2, such as additional data acquisition and processing controls, display panels, user interfaces, and so forth.

Additionally or alternatively, many other devices may incorporate a voltage sensing system, such as the voltage sensing system 100 in FIG. 1. For example, an unmanned vehicle (e.g., drone) may incorporate the voltage sensing system 100. The unmanned vehicle may be capable of moving through the air, over water, underwater, over ground surfaces, and/or through ground surfaces. In certain embodiments, the unmanned vehicle may be autonomously controlled. In some embodiments, an operator may control operation of the unmanned vehicle.

Figure 3:
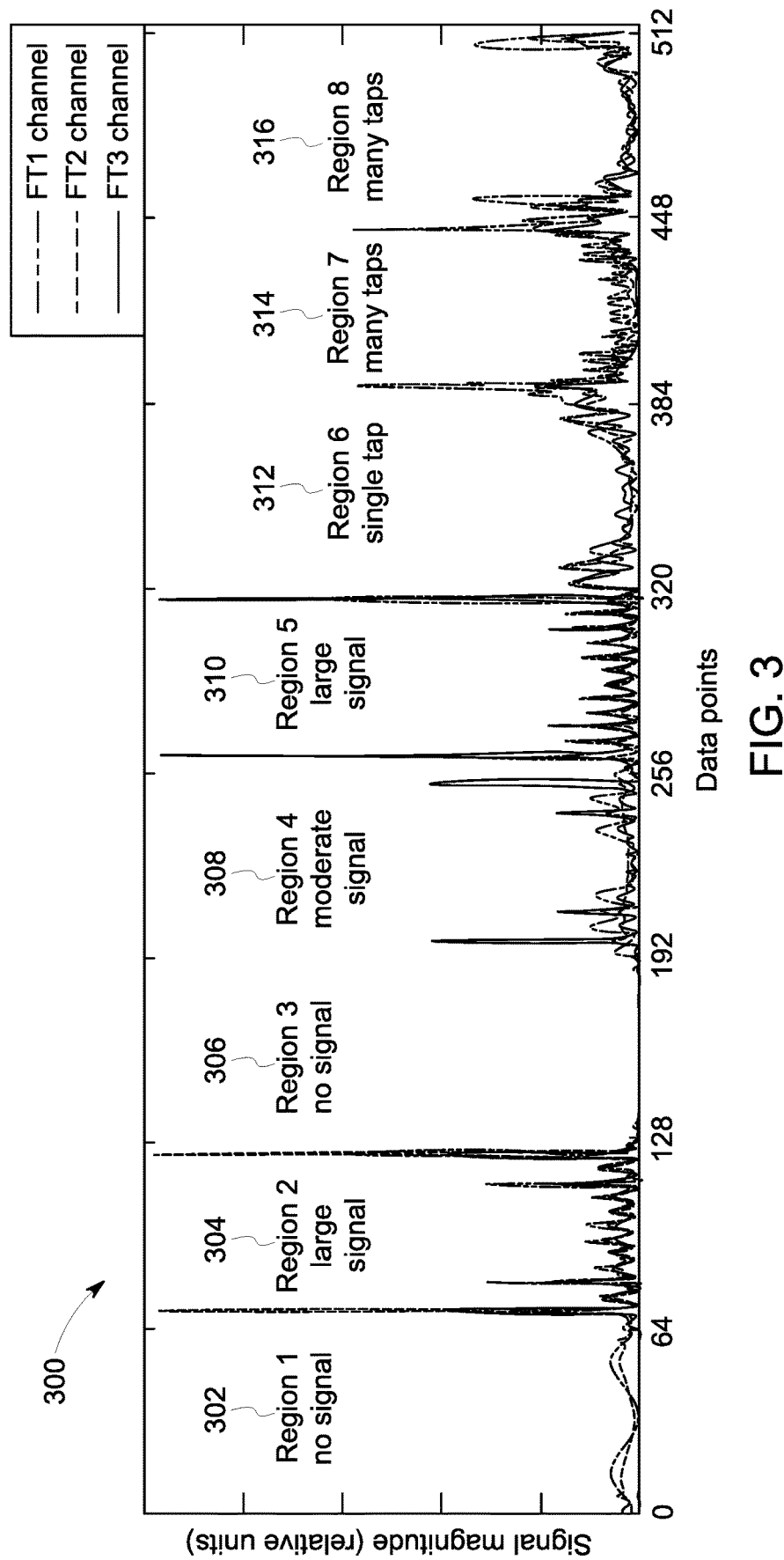
FIG. 3 is a graph of signals received at a voltage sensing system, such as the voltage sensing system of FIG. 1, in accordance with an embodiment of the present disclosure.

With the preceding in mind, and turning to FIG. 3, a graph 300 depicting results of a Fourier transform signal analysis of a voltage sensing system, such as voltage sensing system 100 in FIG. 1, is illustrated. A processor, such as processor 104 in FIG. 1, may perform a Fourier transform on a set of signal data detected by a sensor, such as sensor 110 in FIG. 1. The processor 104 may separate the set of signals into respective frequencies present in the set of signals, as shown in FIG. 3. In a first region 302 and a third region 306, a signal from an active AC voltage source is absent. As shown in FIG. 3, the first region 302 and third region 306 display relatively minor amplitude fluctuations when compared to other regions. In regions 304, 308, and 310, a signal from an active AC voltage source is present and large amplitude fluctuations with steady periodicity is depicted. In regions 312, 314, and 316, a series of mechanical interference signals generated by tapping on a device incorporating the voltage sensing system resulted in signals with unsteady fluctuations and slower periodicity than the corresponding AC source signals.

Figure 4:
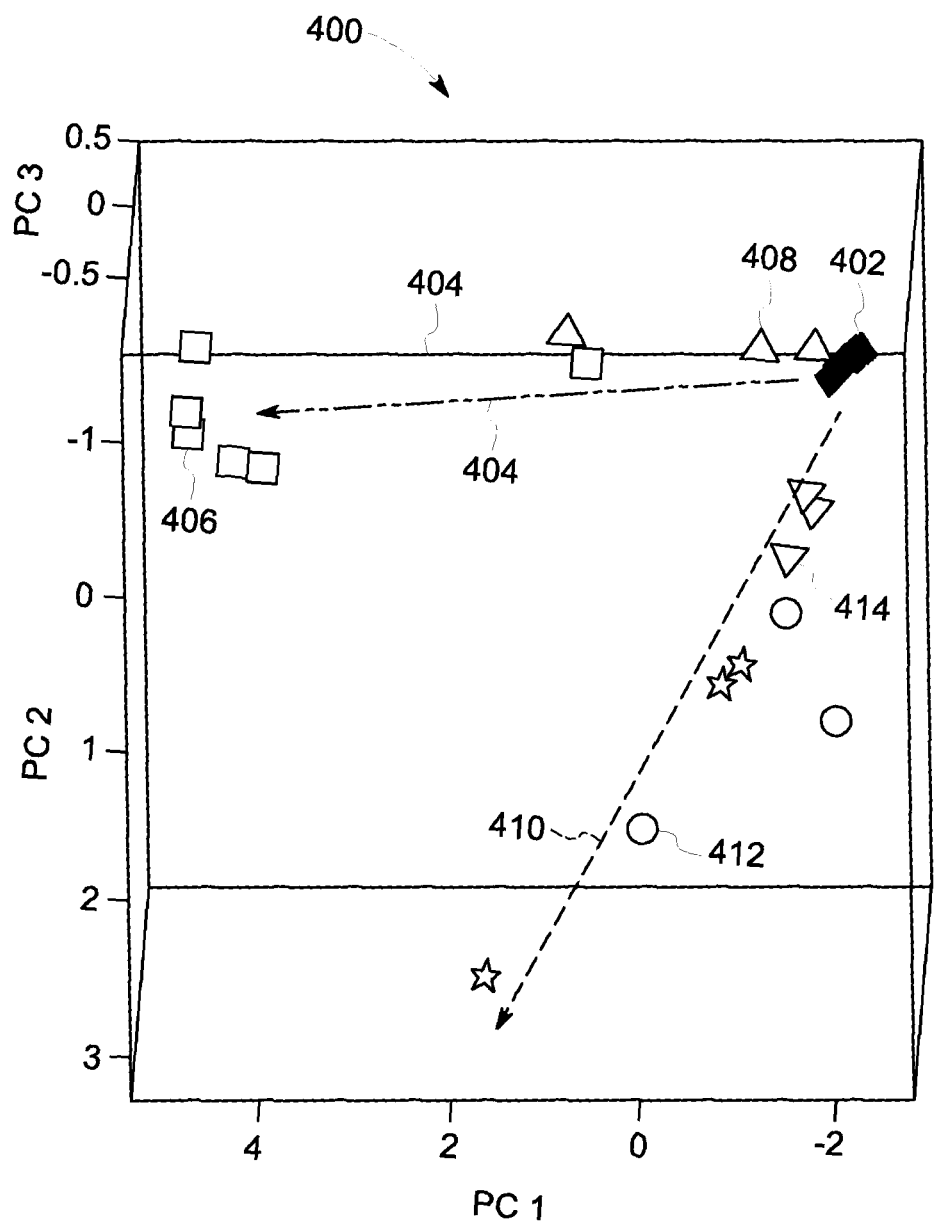
FIG. 4 is a graph of a signal processing step of a voltage sensing system, such as the voltage sensing system of FIG. 1, in accordance with an embodiment of the present disclosure.

With the preceding in mind, and turning to FIG. 4, a graph 400 depicting results of a principal components signal analysis of a voltage sensing system, such as voltage sensing system 100 in FIG. 1, is illustrated. A processor, such as processor 104 in FIG. 1, may perform a principal components analysis on a Fourier transformed set of signal data. The processor 104 may process the Fourier transformed set of signal data and separate the Fourier transformed set of signal data according to an amount of variance. For example, the principal component analysis may focus on the periodicity and the frequency of the Fourier transformed set of signal data relative to when no signal is detected. For example, the graph 400 depicts a point 402 during which electromagnetic radiation from an active AC voltage source is absent. Along a first direction 404, point 406 and point 408 depict an active AC voltage source with a strong signal and moderate signal, respectively. In a second direction 410, point 412 and point 414 depict mechanical interference signals from many taps on a housing of a voltage sensing device and a single tap on a housing of a voltage sensing device, respectively. As depicted in FIG. 4, the processor 104 may separate interference signal data from active AC voltage source signal data. In certain embodiments, the processor 104 may perform signal processing steps to separate interference signal data such as ambient background electromagnetic radiation, mechanical interference, vibrations, electrostatic interference, and any other suitable forms of interference. As a result, the processor 104 may accurately determine voltages corresponding to active AC voltage sources.

Figure 5:
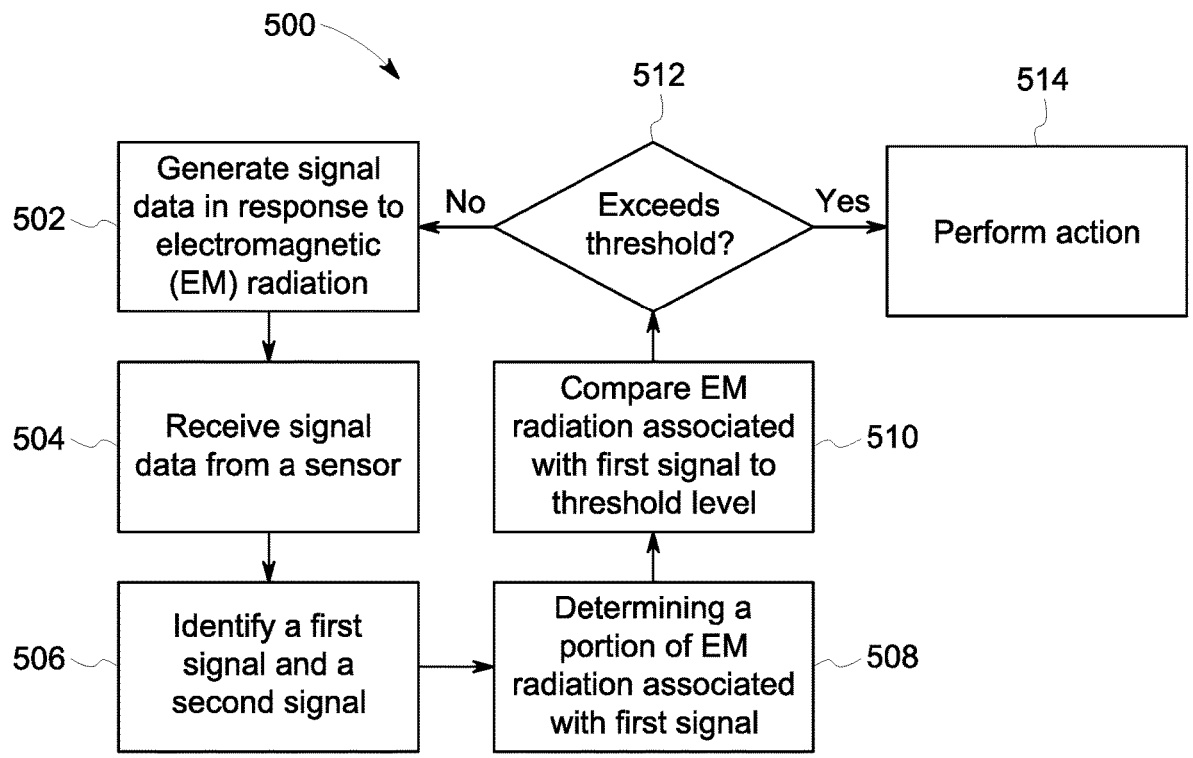
FIG. 5 is a process flow of a voltage sensing process, in accordance with aspects of the present disclosure.

With the preceding in mind, FIG. 5 is a flow diagram of a process 500 for detecting an active AC voltage source using a voltage sensing system, such as voltage sensing system 100 in FIG. 1, in accordance with an embodiment of the present disclosure. While the process 500 is described as being performed by the processor 104, it should be understood that the process 500 may be performed by any suitable device that may control and/or communicative with components of the voltage sensing system 100. Furthermore, while the process 500 is described using steps in a specific sequence, it should be understood that the present disclosure contemplates that the described steps may be performed in different sequences than the sequence illustrated, and certain described steps may be skipped or not performed altogether. In some embodiments, the process 500 may be implemented by executing instructions stored in a tangible, non-transitory, computer-readable medium, such as the memory 108, using any suitable processing circuitry, such as the processor 104.

In this flow, a user input is received, for example at the user input device 112 of FIG. 1. In response to the user input, the sensor 110 may begin a sensing mode so that the sensor 110 may detect electromagnetic radiation (step 502). Alternatively, the sensor 110 may be a passive sensor and may continuously detect electromagnetic radiation. The sensor 110 may send sensor data corresponding to detected electromagnetic radiation to data acquisition circuitry 106. The data acquisition circuitry 106 may receive the sensor data generated by the sensor 110 representing sensed voltage from a source 120. The data acquisition circuitry 106 may generate a set of signal data corresponding to the set of sensor data and the processor 104 may receive the set of signal data (step 504).

At step 506, the processor 104 may identify a first signal within a first frequency range and a second signal associated with an interference signal in the set of signal data. In certain embodiments, the processor 104 may perform signal analysis on the signal data to identify the first signal and the second signal. The processor 104 may perform any number of signal processing steps on the set of signal data including Fourier transform analysis, wavelet analysis, principal components analysis, neural network analysis, hierarchical cluster analysis, and any other suitable signal processing analysis. For example, the processor 104 may perform a Fourier transform analysis on the set of signal data received via the data acquisition circuitry 106. The processor 104 may transform the signal data from a time domain representation to a frequency domain representation. For example, the processor 104 may process the signal data and separate a waveform associated with the signal data showing fluctuations in frequency over time into a set of signal components each with a corresponding frequency. In certain embodiments, the processor 104 may filter the Fourier transformed set of signal data. For example, the processor 104 may filter out components of the Fourier transformed set of signal data outside of a specified frequency range, such as between forty and four hundred Hz. Alternatively, the processor 104 may filter out components of the Fourier transformed set of signal data outside of a frequency range between forty to sixty Hz.

In some embodiments, the processor 104 may perform principal component analysis on the Fourier transformed set of signal data to identify interferences and/or sources 120 of electromagnetic radiation. The processor 104 may process the Fourier transformed set of signal data and separate the Fourier transformed set of signal data according to an amount of variance. For example, the principal component analysis may focus on the periodicity and the frequency of the Fourier transformed set of signal data relative to when no signal is detected. In certain embodiments, active AC voltage sources may have more steady periodicity and less amplitude fluctuations relative to outside interference. Outside interference may be mechanical interference, ambient background electromagnetic radiation, vibrations, electric charge build-up, electrostatic interference, and any other suitable forms of interference. The processor 104 may identify a portion of the set of signal data corresponding to active AC voltage sources.

At step 508, the processor 104 may determine a portion of the detected electromagnetic radiation associated with the identified first signal. For example, the processor 104 may measure a voltage associated with the first signal. The processor 104 may measure a voltage associated with the first signal based on the sensed voltage from the sensor 110. In certain embodiments, the processor 104 may measure the voltage based on the root mean square amplitude of the sensed voltage over one cycle. In some embodiments, the processor 104 may measure the voltage based on a peak amplitude of the sensed voltage.

At step 510, the processor 104 may compare the electromagnetic radiation associated with the first signal to a threshold level of electromagnetic radiation. For example, the processor 104 may compare a measured voltage associated with the first signal to a threshold voltage level. At step 512, the processor 104 may determine whether the electromagnetic radiation associated with the first signal exceeds a threshold level of electromagnetic radiation. For example, the processor 104 may determine whether the measured voltage exceeds a threshold voltage. In certain embodiments, the threshold voltage may be a dynamic voltage and may be adjustable by a user with the user input device 112. For example, the threshold voltage may be fifty volts, one hundred volts, two hundred volts, five hundred volts, one thousand volts, and so on.

At step 514, the processor 104 may send a signal to the display 114 to generate an alert in response to the measured voltage meeting or exceeding the threshold voltage. In some embodiments, the alert may be an audio alert, a visual alert, and/or a tactile alert. Additionally or alternatively, the processor 104 may send a shut-off signal to the active AC voltage source in response to the measured voltage exceeding the threshold voltage. In some embodiments, the processor 104 may send a signal to a vehicle to move away from the active AC voltage source in response to the measured voltage exceeding the threshold voltage. Additionally or alternatively, the processor 104 may send a signal indicative of the alert to other nearby voltage sensing devices. If the processor determines the measured voltage fails to exceed the threshold voltage, the process 500 may return to step 502 and wait for an additional set of signal data to be received.

Figure 6:
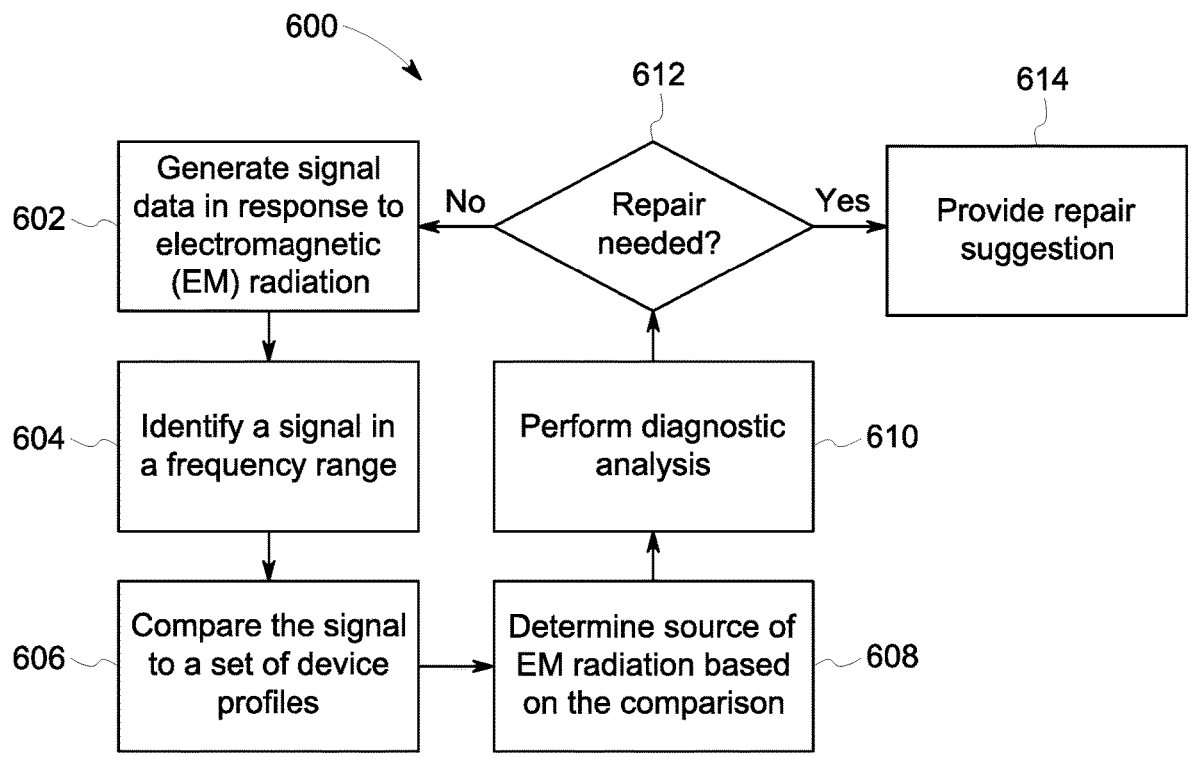
FIG. 6 is a process flow of a device identification process, in accordance with aspects of the present disclosure.

With the preceding in mind, FIG. 6 is a flow diagram of a process 600 for identifying a device associated with an active AC voltage source using a voltage sensing system, such as the voltage sensing system 100 in FIG. 1, in accordance with an embodiment of the present disclosure. While the process 600 is described as being performed by the processor 104, it should be understood that the process 600 may be performed by any suitable device that may control and/or communicative with components of the voltage sensing system 100. Furthermore, while the process 600 is described using steps in a specific sequence, it should be understood that the present disclosure contemplates that the described steps may be performed in different sequences than the sequence illustrated, and certain described steps may be skipped or not performed altogether. In some embodiments, the process 600 may be implemented by executing instructions stored in a tangible, non-transitory, computer-readable medium, such as the memory 108, using any suitable processing circuitry, such as the processor 104.

In this flow, a user input is received, for example at the user input device 112 of FIG. 1. In response to the user input, the sensor 110 may begin a sensing mode so that the sensor 110 may detect electromagnetic radiation (step 602). Alternatively, the sensor 110 may be a passive sensor and may continuously detect electromagnetic radiation. The sensor 110 may send sensor data corresponding to detected electromagnetic radiation to data acquisition circuitry 106. The data acquisition circuitry 106 may receive the sensor data generated by the sensor 110 representing sensed voltage from a source 120. The data acquisition circuitry 106 may generate a set of signal data corresponding to the set of sensor data and may transmit the set of signal data to the processor 104.

At step 604, the processor 104 may identify a first signal within a first frequency range. In certain embodiments, the processor 104 may perform signal analysis on the signal data to identify the first signal. The processor 104 may perform any number of signal processing steps on the set of signal data including Fourier transform analysis, wavelet analysis, principal components analysis, neural network analysis, hierarchical cluster analysis, and any other suitable signal processing analysis. For example, the processor 104 may perform a Fourier transform analysis on the set of signal data received via the data acquisition circuitry 106. The processor 104 may transform the signal data from a time domain representation to a frequency domain representation. For example, the processor 104 may process the signal data and separate a waveform associated with the signal data showing fluctuations in frequency over time into a set of signal components each with a corresponding frequency. In certain embodiments, the processor 104 may filter the Fourier transformed set of signal data. For example, the processor 104 may filter out components of the Fourier transformed set of signal data outside of a specified frequency range, such as between forty and four hundred Hz. Alternatively, the processor 104 may filter out components of the Fourier transformed set of signal data outside of a frequency range between forty to sixty Hz.

In some embodiments, the processor 104 may perform principal component analysis on the Fourier transformed set of signal data to identify interferences and/or sources 120 of electromagnetic radiation. The processor 104 may process the Fourier transformed set of signal data and separate the Fourier transformed set of signal data according to an amount of variance. For example, the principal component analysis may focus on the periodicity and the frequency of the Fourier transformed set of signal data relative to when no signal is detected. In certain embodiments, active AC voltage sources may have more steady periodicity and less amplitude fluctuations relative to outside interference. Outside interference may be mechanical interference, ambient background electromagnetic radiation, vibrations, electric charge build-up, electrostatic interference, and any other suitable forms of interference. The processor 104 may identify a portion of the set of signal data corresponding to active AC voltage sources.

At step 606, the processor 104 may compare the signal data to the set of device profiles 118 stored in the storage device 116. The processor 104 may measure a voltage associated with the signal component based on the sensed voltage from the sensor 110. In certain embodiments, the processor 104 may measure the voltage based on the root mean square amplitude of the sensed voltage over one cycle. In some embodiments, the processor 104 may measure the voltage based on a peak amplitude of the sensed voltage. The processor 104 may determine a frequency associated with the signal component is within a threshold similarity amount of the characteristic frequency of a device profile 118. In some embodiments, the processor 104 may determine the frequency associated with the signal component, the voltage associated with the signal component, and a number of phases associated with the signal component all are within respective threshold similarity amounts of a characteristic frequency associated with the device profile 118, a characteristic voltage associated with the device profile 118, and a number of phases associated with the device profile 118, respectively.

At step 608, the processor 104 may analyze the signal data and may determine a device associated with a signal component based on the comparison. In certain embodiments, the processor 104 may determine a device associated with a signal component based on a comparison with multiple identifying features associated with the device profile 118. The processor 104 may identify the source of the signal component and may send a signal to the display 114 to generate an indication associated with the identified source. For example, the indication may include the device type, the device name, the manufacturer of the device, and/or the model number of the device.

At step 610, the processor 104 may perform a diagnostic analysis on a source of electromagnetic radiation. In certain embodiments, the user input device 112 may be capable of receiving an input from a user to select a device profile 118 stored in the storage device 116. For example, the user of the voltage sensing system 100 may identify a device in need of repair and may select the corresponding device profile 118 using the user input device 112. Alternatively, the processor 104 may identify the device based on a comparison between signal data detected by the sensor 110 and the set of device profiles 118. The processor 104 may compare the device profile 118 to signal data detected by the sensor 110 and may produce a diagnostic report. For example, the processor may send a signal to the display 114 to generate an indication associated with the diagnostic report.

At step 612, the processor 104 may determine some form of repair is needed for the identified AC voltage source. At step 614, the processor 104 may provide a repair suggestion in response to determining repair is needed for the identified AC voltage source. For example, the processor 104 may determine a part of the device needs to be replaced and may send a message to place an order for the part. In another embodiment, the processor 104 may produce and send a diagnostic report. If the processor determines the no repair is needed, the process 600 may return to step 602 and wait for an additional set of signal data to be generated.

In certain embodiments, the processes 500, 600 may include additional steps, such as sending control signals to a sensor. In certain embodiments, the processes 500, 600 may include performing filtering and/or amplification on the set of sensor data. For example, the data acquisition circuitry 106 may filter out components of the set of sensor data outside of a specified frequency range, such as between forty and four hundred Hz. Alternatively, the data acquisition circuitry 106 may filter out components of the set of sensor data outside of a frequency range between forty to sixty Hz.

Technical effects of the invention include, but are not limited to, data processing and increased accuracy for voltage sensing devices, diagnostic evaluations of electromagnetic radiation sources, and identification of electromagnetic radiation sources.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A wearable device, comprising:
a sensor configured to detect electromagnetic radiation and generate a set of signal data over a first time period in response to detected electromagnetic radiation; and
a processor communicatively coupled to the sensor, the processor configured to:
identify a first signal of the set of signal data and a second signal of the set of signal data, the first signal having a frequency in a frequency range and the second signal is associated with an interference signal;
determine, based on the identification, a portion of the detected electromagnetic radiation associated with the first signal;
determine whether a portion of the detected electromagnetic radiation associated with the first signal exceeds a threshold level; and
perform an action based on a determination that the portion of the electromagnetic radiation exceeds the threshold level.

2. The device of claim 1, wherein the action comprises generating an alert, and wherein the alert comprises an audible signal, a visual signal, a tactile signal, or a combination thereof.

3. The device of claim 1, wherein the processor is further configured to:
compare the first signal to a device profile stored in a database; and
based on the comparison, determine device identification information associated with the first signal.

4. The device of claim 3, wherein the device identification information comprises a device name, a device type, a model number, a manufacturer, or a combination thereof.

5. The device of claim 4, wherein the action comprises sending a shut-off signal to a device associated with the device identification information or a power-controller unit associated with the device identification information.

6. The device of claim 1, wherein the processor is further configured to:
compare the first signal to a combination of device profiles stored in a database; and
based on the comparison, determine a combination of devices associated with the first signal.

7. The device of claim 1, wherein the processor is further configured to perform a multivariate signal classification on the set of signal data as part of identifying the first signal and the second signal.

8. The device of claim 7, wherein the processor is further configured to perform a frequency-domain analysis of the set of signal data as part of performing the multivariate signal classification.

9. The device of claim 7, wherein the processor is further configured to perform a principal components analysis of the set of signal data as part of performing the multivariate signal classification.

10. A method, comprising:
generating a set of signal data over a first time period in response to detected electromagnetic radiation;
identifying a first signal of the set of signal data and a second signal of the set of signal data, the first signal having a frequency in a frequency range and the second signal is associated with an interference signal;
determining, based on the identification, whether a voltage level of the first signal exceeds a threshold voltage level; and
performing an action based on the voltage level of the first signal exceeding the threshold voltage level.

11. The method of claim 10, further comprising comparing the first signal to a set of device profiles, wherein each device profile corresponds to a different source of electromagnetic radiation.

12. The method of claim 11, further comprising determining, based on the comparison, a combination of two or more sources of electromagnetic radiation.

13. The method of claim 11, wherein each device profile is associated with a frequency of a device, a voltage of a device, a number of phases of a device, a phase angle of a device, or a combination thereof.

14. The method of claim 10, comprising performing a multivariate signal classification on the set of signal data as part of identifying the first signal and the second signal.

15. A diagnostic tool, comprising:
a sensor configured to detect electromagnetic radiation and generate a set of signals over a first time period in response to detected electromagnetic radiation; and
a processor communicatively coupled to the sensor, the processor configured to:
identify at least one signal from the set of signals, the at least one signal having a frequency in a frequency range;
compare the at least one signal to a set of device profiles, each device profile corresponding to a different source of electromagnetic radiation; and determine a source of electromagnetic radiation for the at least one signal based on the comparison.

16. The diagnostic tool of claim 15, wherein the detected electromagnetic radiation is voltage.

17. The tool of claim 16, further comprising a housing configured to shield the sensor from electromagnetic radiation not originating from a first direction.

18. The tool of claim 16, wherein the processor is further configured to produce a diagnostic report for the determined source of electromagnetic radiation based on the at least one signal and the comparison.

19. The tool of claim 18, wherein the diagnostic report comprises an identification of a faulty component.

20. The tool of claim 16, the diagnostic tool further comprising a display, wherein the processor is further configured to send an indication associated with the source of electromagnetic radiation to the display.

* * * * *